United States Patent [19]
Baliga

[11] Patent Number: 5,912,497
[45] Date of Patent: Jun. 15, 1999

[54] SEMICONDUCTOR SWITCHING DEVICES HAVING BURIED GATE ELECTRODES AND METHODS OF FORMING SAME

[75] Inventor: Bantval Jayant Baliga, Raleigh, N.C.

[73] Assignee: North Carolina State University, Raleigh, N.C.

[21] Appl. No.: 08/906,916

[22] Filed: Aug. 6, 1997

[51] Int. Cl.⁶ .................................................. H01L 29/78
[52] U.S. Cl. ......................... 257/366; 257/139; 257/378
[58] Field of Search ..................................... 257/139, 141, 257/365, 366, 378

[56] References Cited

U.S. PATENT DOCUMENTS

| | | | |
|---|---|---|---|
| 4,903,189 | 2/1990 | Ngo et al. ................................ | 257/331 |
| 5,168,331 | 12/1992 | Yilmaz .................................... | 257/331 |
| 5,396,087 | 3/1995 | Baliga ..................................... | 257/139 |
| 5,413,313 | 5/1995 | Mutterlein et al. ..................... | 257/378 |
| 5,488,236 | 1/1996 | Baliga et al. ........................... | 257/378 |

*Primary Examiner*—Gene M. Munson
*Attorney, Agent, or Firm*—Myers Bigel Sibley & Sajovec

[57] ABSTRACT

Semiconductor switching devices having buried gate electrodes include a substrate, a drift region of first conductivity type (e.g., N−) extending to a face of the substrate and a first insulated gate electrode buried in the drift region. The first insulated gate electrode extends laterally in the substrate in spaced relation to the face. A second gate electrode is also provided on the face at a location extending opposite the first insulated gate electrode. A base region of second conductivity type (e.g., P) is also provided in the substrate, between the second gate electrode and an upper surface of the first insulated gate electrode. Similarly, an emitter region of first conductivity type (e.g., N+) is provided between the first face and the upper surface of the first insulated gate electrode. The base region is defined so that respective P-N junctions are formed with the emitter and drift regions. These P-N junctions preferably extend between the upper surface of the first insulated gate electrode and the first face. First and second electrodes are also electrically coupled to the emitter and the drift regions, respectively. In the event the semiconductor switching device comprises an insulated gate bipolar transistor (IGBT), the first electrode is preferably coupled to the emitter region at the first face and the second electrode is preferably disposed on a second face of the substrate and is indirectly coupled through a collector region of second conductivity type (e.g., P+) and a buffer region of first conductivity type (e.g., N+) to the drift region.

10 Claims, 6 Drawing Sheets

SEMICONDUCTOR SWITCHING DEVICES HAVING BURIED GATE ELECTRODES AND METHODS OF FORMING SAME

FIELD OF THE INVENTION

The present invention relates to semiconductor devices and methods of forming semiconductor devices, and more particularly to semiconductor switching devices for high power applications and related methods.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also easily be paralleled, because the forward voltage drop of power MOSFETs increases with increasing temperature, thereby promoting an even current distribution in parallel connected devices.

Figure 1:
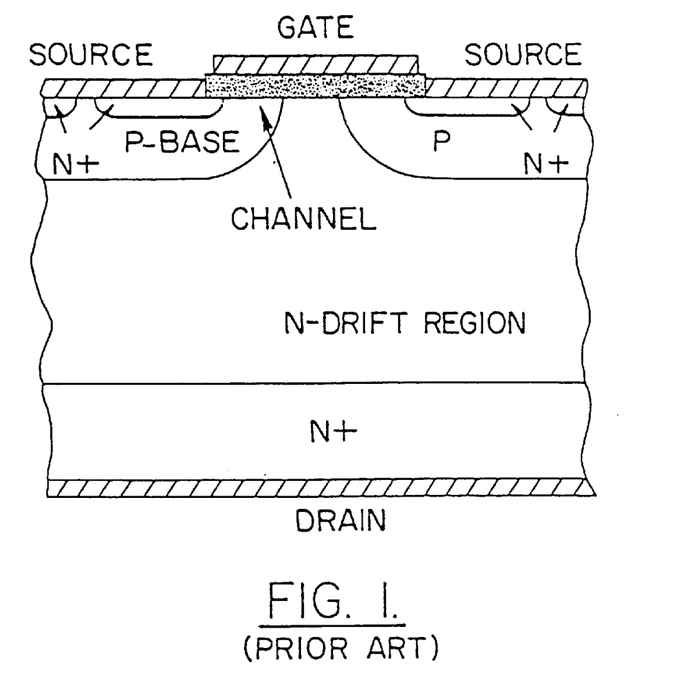
FIG. 1 is a cross-sectional illustration of a prior art silicon power DMOSFET.

In view of these desirable characteristics, many variations of power MOSFETs have been designed. Two popular types are the double-diffused MOS (DMOS) device and the ultra-low on-resistance MOS device (UMOS). The DMOS structure and its operation and fabrication are described in the textbook by inventor Baliga entitled *Modern Power Devices*, the disclosure of which is hereby incorporated herein by reference. Chapter 6 of this textbook describes power MOSFETs at pages 263–343. FIG. 1 herein is a reproduction of FIG. 6.1($a$) from the above cited textbook, and illustrates a cross-sectional view of a basic DMOS structure. The DMOS structure is fabricated using planar diffusion technology.

Figure 2:
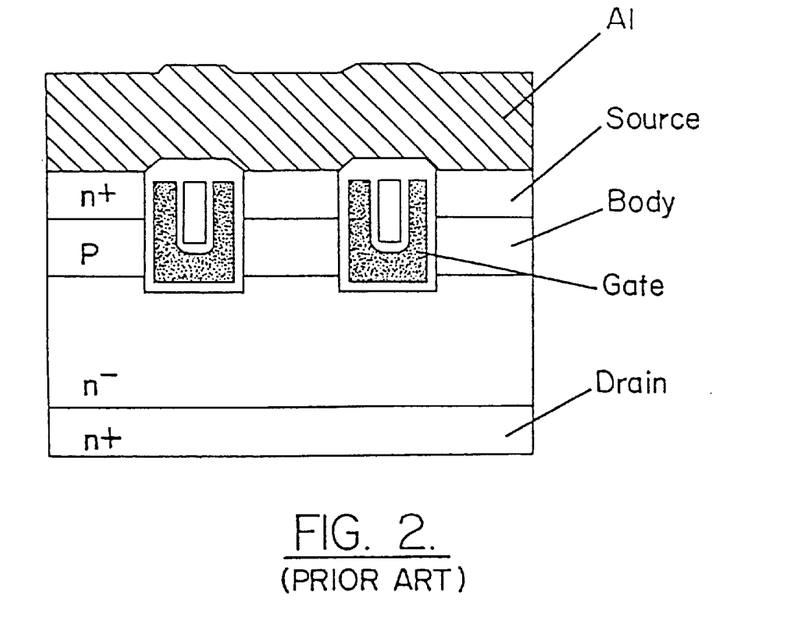
FIG. 2 is a cross-sectional illustration of a prior art silicon power UMOSFET.

The UMOS device, also referred to as a "Trench DMOS" device, is described in publications entitled: An Ultra-Low On-Resistance Power MOSFET Fabricated by Using a Fully Self-Aligned Process, by Ueda et al., IEEE Transactions on Electron Devices, Vol. ED34, No. 4, April (1987), pp. 926–930; Numerical and Experimental Comparison of 60 V Vertical Double-Diffused MOSFETS and MOSFETS with a Trench-Gate Structure by Chang, Solid State Electronics, Vol. 32, No. 3, pp. 247–251 (1989); Trench DMOS Transistor Technology for High-Current (100A Range) Switching by Bulucea et al., Solid State Electronics, Vol. 34, No. 5, pp. 493–507 (1991); and Extended Trench-Gate Power UMOSFET Structure with Ultralow Specific On-Resistance, by Syau et al., Electronics Letters, Vol. 28, No. 9, pp. 865–867 (1992). FIG. 2 herein is a reproduction of a portion of FIG. 1 of the above identified Ueda et al. publication illustrating an embodiment of the UMOS structure.

Figure 3:
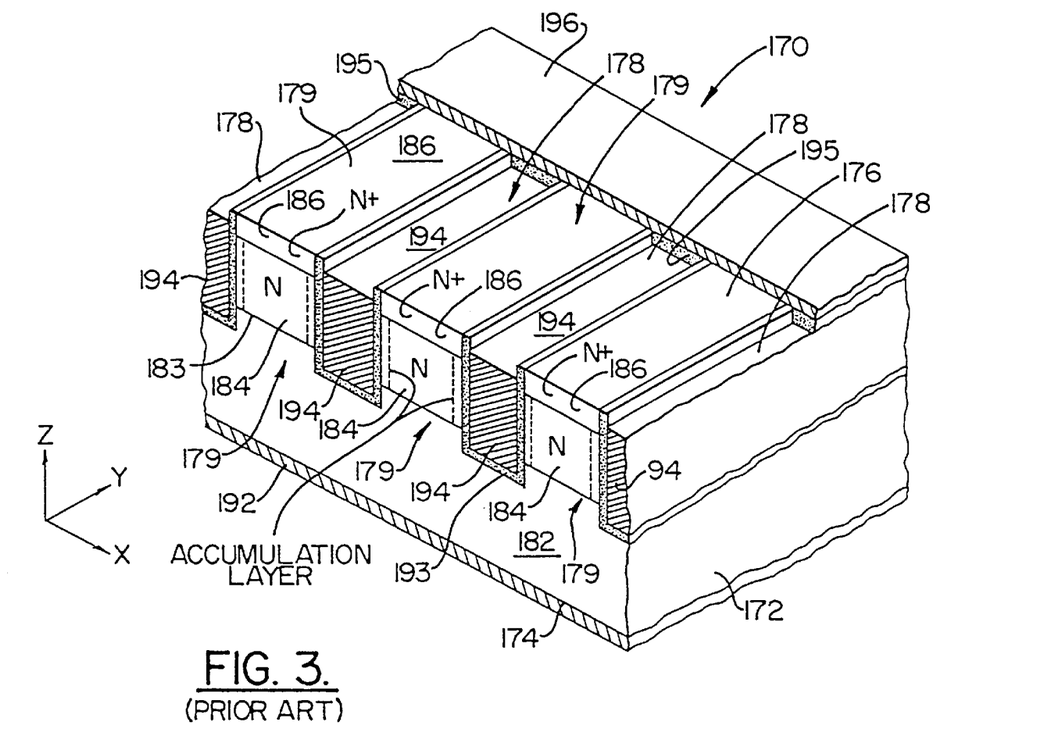
FIG. 3 is a cross-sectional illustration of a prior art silicon ACCUFET.

A third example of a silicon power MOSFET is shown in FIG. 3. FIG. 3 is a reproduction of FIG. 4 from U.S. Pat. No. 4,903,189 to Ngo et al. and inventor Baliga, the disclosure of which is hereby incorporated herein by reference. This MOSFET 170, which includes trenches 178 at a face thereof and contains no P-N junctions, is commonly referred to as an accumulation-mode FET ("ACCU-FET") because turn-on is achieved by forming a conductive accumulation layer between the FET's source 186 and drain 182 regions. FIG. 3 shows a plurality of parallel connected ACCU-FET cells, each defined by mesas 179 and opposing trenches 178.

Figure 4A:
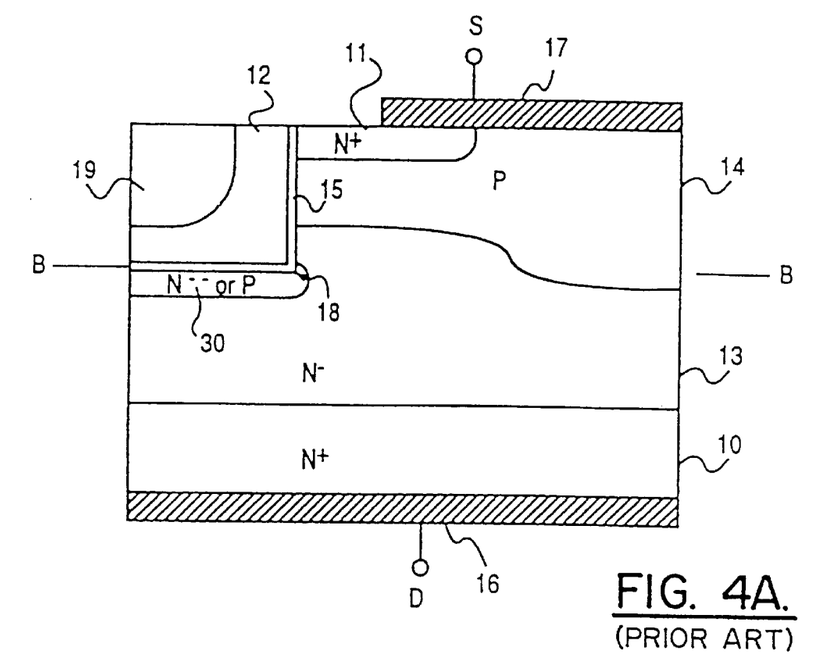
FIG. 4A is a cross-sectional illustration of a prior art high-power MOSFET.

A fourth example of a vertical power MOSFET is shown in FIG. 4A. FIG. 4A is a reproduction of FIG. 3 from U.S. Pat. No. 5,168,331 to H. Yilmaz. In particular, this MOSFET includes a "free floating" shield region 30 (P or N−) which serves as a buffer to reduce the strength of the electric field at point 18, which is adjacent to a corner in the profile of the gate 12.

The above-described beneficial characteristics of power MOSFETs are typically offset, however, by the relatively high on-resistance of the MOSFET's channel region, which arises from the absence of minority carrier injection. As a result, a MOSFET's operating forward current density is typically limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. One example of a hybrid device is the Insulated Gate Bipolar Transistor (IGBT), disclosed in section 7.2 of the aforementioned Baliga textbook.

The IGBT combines the high impedance gate of the power MOSFET with the small on-state conduction losses of the power bipolar transistor. An added feature of the IGBT is its ability to block both forward and reverse bias voltages. Because of these features, the IGBT has been used extensively in inductive switching circuits, such as those required for motor control applications. These applications require devices having wide forward-biased safe-operating-area (FBSOA) and wide reverse-biased safe-operating-area (RBSOA).

One embodiment of an IGBT is disclosed in an article by inventor B. J. Baliga and M. S. Adler, R. P. Love, P. V. Gray and N. Zommer, entitled The Insulated Gate Transistor: A New Three terminal MOS Controlled Bipolar Power Device, IEEE Trans. Electron Devices, ED-31, pp. 821–828 (1984), the disclosure of which is hereby incorporated herein by reference. Based on experimental results, on-state losses were shown to be greatly reduced when compared to power MOSFETs. This was caused by the conductivity modulation of the IGBT's drift region during the on-state. Moreover, very high conduction current densities in the range of 200–300 A/cm$^2$ were also achieved. Accordingly, an IGBT can be expected to have a conduction current density approximately 20 times that of a power MOSFET and five (5) times that of an equivalent bipolar transistor. Typical turn-off times for the IGBT can be in the range of 10–50 µs.

Figure 5A:
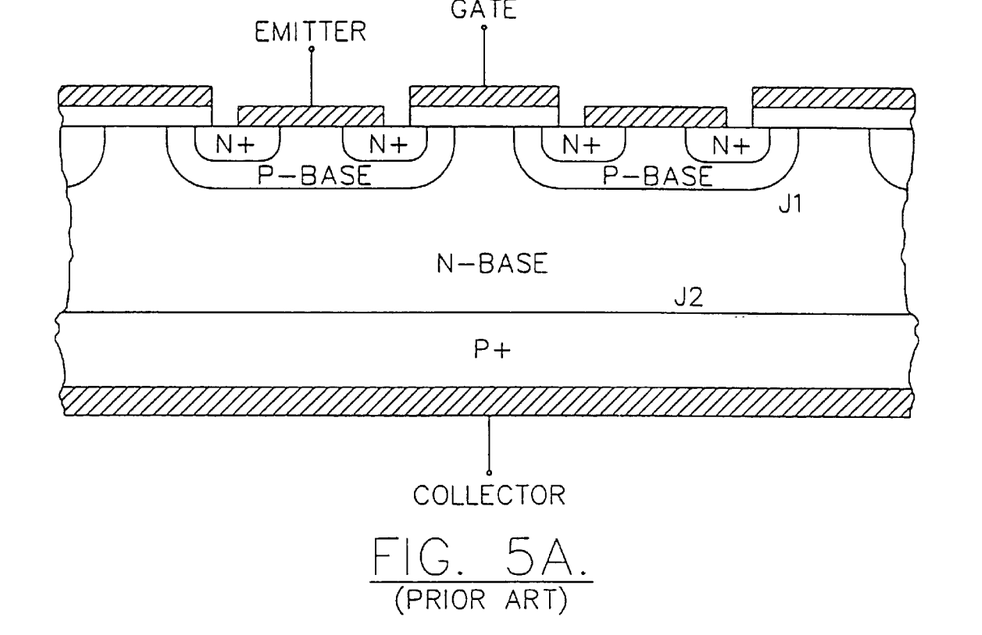
FIG. 5A is a cross-sectional illustration of another prior art IGBT.

The basic structure of the IGBT is shown in cross-section in FIG. 5A, which is a reproduction of FIG. 1 from the aforementioned Baliga et al. article. In the IGBT, forward conduction can occur by positively biasing the anode (or electron "collector") with respect to the cathode (or electron "emitter") and applying a positive gate bias of sufficient magnitude to invert the surface of the P-base region under the gate. By creating an inversion layer in the P-base region, electrons are allowed to flow from the N+ emitter region to the N-base region. In this forward conducting state, the junction J2 is forward biased and the P+ anode region injects holes into the N-Base region. As the anode bias is increased, the injected hole concentration increases until it exceeds the background doping level of the N-base. In this regime of operation, the device operates like a forward-biased P-i-N diode with heavy conductivity modulation of the N-base region. In the reverse bias region, the anode is biased negative with respect to the cathode and the lower junction (J3) is reversed biased, thereby preventing conduction from the cathode to anode even though the upper junction (J2) is forward biased. This provides the device with its reverse blocking capability.

Figure 4B:
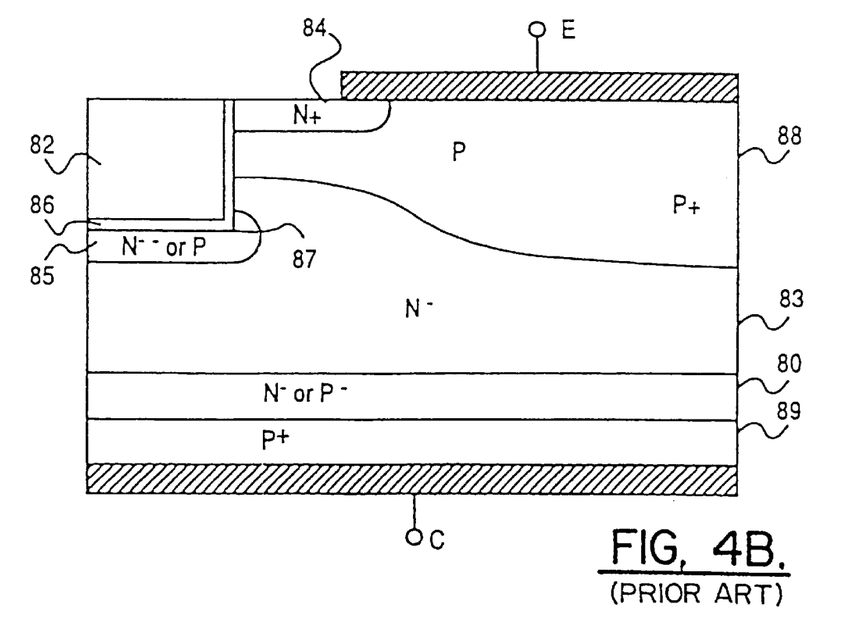
FIG. 4B is a cross-sectional illustration of a prior art IGBT.

Another IGBT which includes a "free floating" shield region for improving the reverse blocking capability is shown in FIG. 4B, which is a reproduction of FIG. 10 from the aforementioned '331 patent to Yilmaz. In particular, this IGBT includes a "free floating" shield region 85 (P or N−) which serves as a buffer to reduce the strength of the electric field at point 87, which is adjacent to a corner in the profile of the gate 82.

Figure 5B:
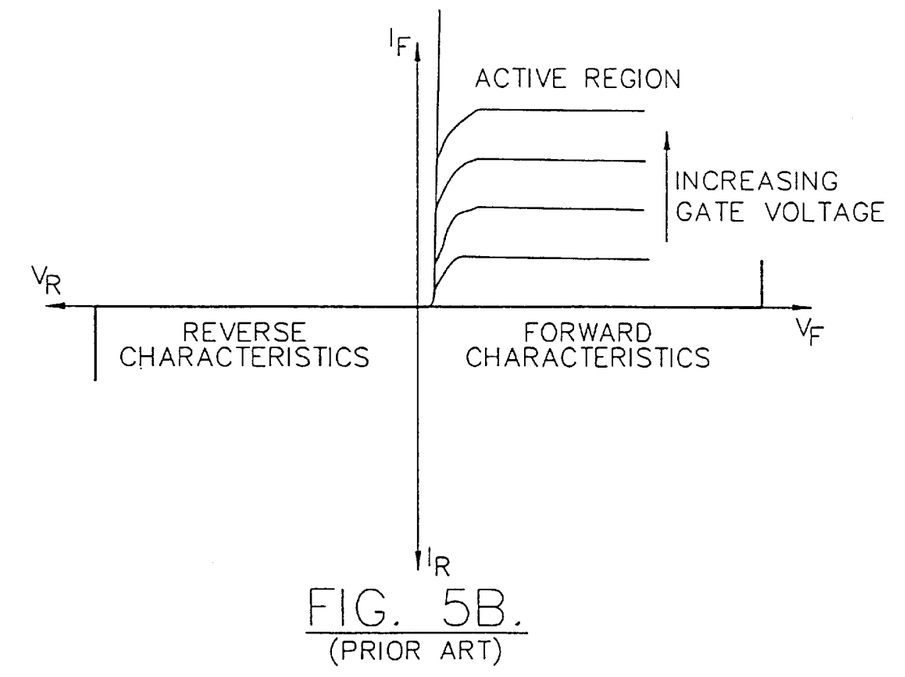
FIG. 5B is a simulated graph of current versus voltage for the IGBT of FIG. 5A, at various gate voltages.

The IGBT can typically operate at high current densities even when designed for operation at high blocking voltages. As long as the gate bias is sufficiently large to produce enough inversion layer charge for providing electrons into the N-base region, the IGBT forward conduction characteristics will look like those of a P-i-N diode. However, if the inversion layer conductivity is low, a significant voltage drop will begin to appear across this region like that observed in conventional MOSFETs. At this point, the forward current will saturate and the device will operate in its active or current saturation region, as shown in FIG. 5B, which is a reproduction of FIG. 2 from the aforementioned Baliga et al. article. As will be understood by those skilled in the art, high voltage current saturation is ultimately limited by avalanche induced breakdown. Finally, because the elimination of the inversion layer cuts off the supply of electrons into the N-base region and because there is no self-sustaining source of electrons to the N-base region, the IGBT will typically turn off even if the anode remains positively biased.

One significant drawback to the operation of IGBTs is the presence of a parasitic P-N-P-N structure between the anode and cathode which can cause a loss in the gate controlled turn-off capability by becoming regenerative at high current densities. The current level at which parasitic thyristor latch-up occurs provides a limit to FBSOA at low anode voltages, while at high anode voltages, FBSOA is limited by dynamic avalanche breakdown.

As will be understood by one skilled in the art, latch-up can be prevented so long as the sum of the current gains of the regeneratively coupled P-N-P and N-P-N transistors ($\alpha_{pnp}$, $\alpha_{npn}$) is less than unity. To inhibit the likelihood of latch-up operation, the current gain of the N-P-N transistor ($\alpha$npn) can be made relatively small by reducing the P-base sheet resistance and/or the width of the N$^+$ source region. This suppresses electron injection from the N$^+$ source region to the P-base because the uppermost P-N junction between the P-base and N$^+$ source is effectively short circuited, thereby eliminating the regenerative P-N-P-N path from between the anode and cathode.

However, as described in an article by J. P Russell, A. M. Goodman, L. A. Goodman and J. M. Neilson, entitled The COMFET-A New High Conductance MOS-Gated Device, IEEE Electron Device Letters, Vol. EDL-4, No. 3, March (1983), pp. 63–65, even devices having a relatively low P-base sheet resistance can be susceptible to regenerative latch-up if sufficiently large forward current densities cause significant emitter injection into the base of the N-P-N transistor (P-base) and cause $\alpha_{npn}$ to increase. To reduce the likelihood of parasitic latch-up, the COMFET structure was modified to include a heavily doped P$^+$ region in the middle of the P-base region, electrically connected to the cathode contact.

Other attempts have also be made to reduce the IGBT's susceptibility to latch-up. For example, in an article by A. M. Goodman, J. P. Russell, L. A. Goodman, C. J. Nuese and J. M. Neilson, entitled Improved COMFETs with Fast Switching Speed and High-Current Capability, IEEE International Electron Devices Meeting Digest, Abstract 4.3, (1983), pp. 79–82, a highly doped (N$^+$) epitaxial layer was formed on top of the P$^+$ anode region at junction J3 in order to lower the gain of the lower P-N-P transistor ($\alpha_{pnp}$) and thereby reduce the likelihood of parasitic latch-up at high current densities.

A hole-bypass technique involving the elimination of one of the two uppermost N-type emitter regions from the uppermost P-base region is also described in an article by A. Nakagawa, H. Ohashi, M. Kurata, H. Yamaguchi and K. Watanabe, entitled Non-Latch-Up 1200v 75A Bipolar-Mode MOSFET with Large ASO IEEE International Electron Devices Meeting Digest, Abstract 16.8, (1984), pp. 860–861. By eliminating the emitter region on one side of the P-base, the hole current collected by the base on that side is provided to the cathode contact without having to travel around an N+ emitter region. This bypass technique reduces the likelihood that the uppermost P-N junction between the P-base and N+ emitter will become forward biased at high current densities.

Another attempt to reduce the IGBT's susceptibility to latch-up is disclosed in U.S. Pat. No. 5,396,087 to Baliga entitled Insulated Gate Bipolar Transistor With Reduced Susceptibility to Parasitic Latch-Up, by inventor Baliga, the disclosure of which is hereby incorporated herein by reference. In this IGBT, injection suppressing means is provided between the N+ emitter and P-base region to prevent minority carrier injection from the N+ emitter to the P-base when the anode is biased positive relative to the cathode. Injection suppressing means preferably includes an electrical insulator such as $SiO_2$.

Notwithstanding these attempts to develop improved IGBTs for high power applications, there still exists a need to develop semiconductor switching devices which have low on-state resistance and high reverse blocking voltage capability. There also exists a need for switching devices which have wide forward safe-operating-area (SOA) and excellent current saturation characteristics.

SUMMARY OF THE INVENTION

It is therefore an object of the present invention to provide semiconductor switching devices having improved current saturation characteristics, and methods of forming same.

It is another object of the present invention to provide semiconductor switching devices having wide forward biased safe-operating-area, and methods of forming same.

It is still another object of the present invention to provide semiconductor switching devices having low forward on-state voltage drop, and methods of forming same.

These and other objects, features and advantages are provided by semiconductor switching devices having buried insulated gate electrodes therein for improving the electrical characteristics of the switching devices. These electrical characteristics include forward on-state voltage drop and forward biased safe-operating-area (FBSOA). According to one embodiment of the present invention, a switching device is provided which includes a semiconductor substrate having a drift region of first conductivity type (e.g., N−) therein extending to a first face thereof and a first insulated gate electrode buried in the semiconductor substrate. The first insulated gate electrode preferably extends laterally in the substrate in spaced relation and substantially parallel to the first face. A second gate electrode is also provided on the first face at a location extending opposite the first insulated gate electrode. The first and second gate electrodes are also preferably electrically connected together. A base region of second conductivity type (e.g., P) is also provided in the substrate, between the second gate electrode and an upper surface of the first insulated gate electrode. Similarly, an emitter region of first conductivity type (e.g., N+) is provided between the first face and the upper surface of the first insulated gate electrode. The base region is defined so that respective P-N junctions are formed with the emitter and drift regions. These P-N junctions preferably extend between the upper surface of the first insulated gate electrode and the first face. First and second electrodes are also electrically coupled to the emitter and the drift regions, respectively. The base and emitter regions may also be shorted together. In particular, in the event the semiconductor switching device comprises an insulated gate bipolar transistor (IGBT), the first electrode is preferably coupled to the emitter region at the first face and the second electrode is preferably disposed on a second face of the substrate and is indirectly coupled through a collector region of second conductivity type (e.g., P+) and a buffer region of first conductivity type (e.g., N+) to the drift region. The emitter and buffer regions may also constitute the source and drain regions of a vertical MOSFET device. A thyristor may also be provided by providing a relatively high resistance electrical connection between the base and emitter regions.

According to a preferred aspect of the present invention, the combination of the second gate electrode on the surface of the substrate and the first buried gate electrode improves the uniformity of the electric field profile and charge carrier distribution in the drift region during on-state current flow. As will be understood by those skilled in the art, the more uniform electric field profile and improved charge carrier distribution lead to lower forward voltage drop. The inclusion of the first buried gate electrode also improves the degree of conductivity modulation in the drift region.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 6:
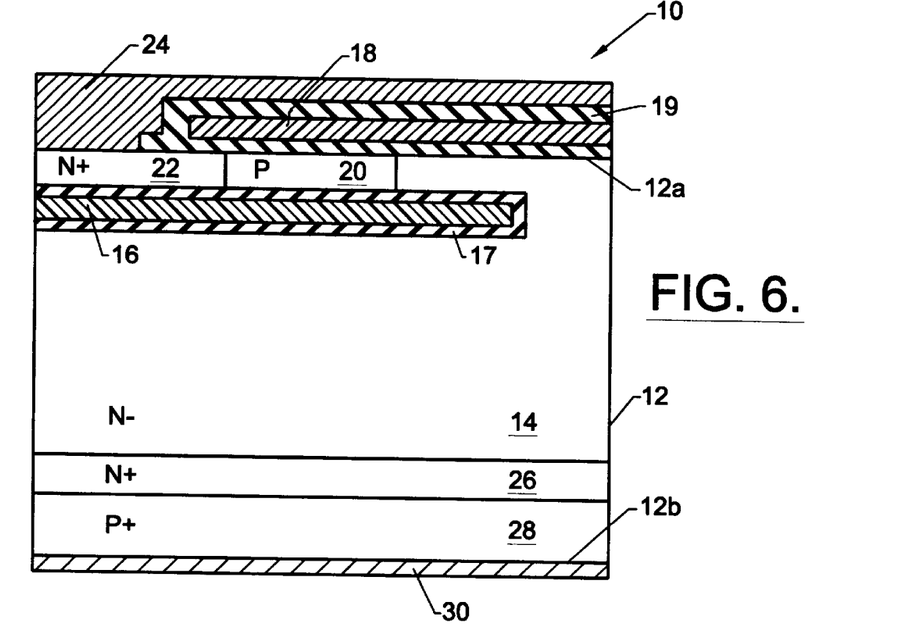
FIG. 6 is a cross-sectional view of a semiconductor switching device according to a first embodiment of the present invention.

Referring now to FIG. 6, a semiconductor switching device 10 according to a first embodiment of the present invention will be described. In particular, the device 10 comprises a semiconductor substrate 12 (e.g., silicon, silicon carbide) having first and second opposing faces 12a and 12b, respectively, and a relatively lightly doped drift region 14 of first conductivity type (shown as N−) therein. A first insulated gate electrode 16 is also provided in the semiconductor substrate 12. The first insulated gate electrode 16 is preferably buried in the substrate 12 in spaced relation to the first face 12a. As illustrated, the first insulated gate electrode 16 extends laterally in the substrate and has an upper surface which extends opposite the first face 12a. As described more fully hereinbelow with respect to FIGS. 7A–7G, the first insulated gate electrode 16 may comprise a doped layer of polycrystalline silicon (poly-Si) surrounded by a thin layer 17 of silicon dioxide which acts as a gate oxide insulating region.

A second gate electrode 18 is also provided on the first face. This second gate electrode 18 may comprise a poly-Si layer which is surrounded by a gate oxide insulating layer 19, as illustrated, or a Schottky metal contact in contact with the first face 12a. The second gate electrode 18 preferably overlaps and extends opposite the first "buried" insulated gate electrode 16. In a multicelled semiconductor switching device, the second gate electrode 18 preferably overlaps the first insulated gate electrodes 16 of adjacent unit cells. In a three-terminal device, the second gate electrode 18 is preferably electrically connected to the first insulated gate electrode 16. As will be understood by those skilled in the art, the illustrated embodiment of FIG. 6 may comprise half of a unit cell of a preferred switching device. A base region 20 of second conductivity type (e.g., P-type) is also provided in the substrate 12, and extends between the second gate electrode 18 and an upper surface of the first insulated gate electrode 16. The base region 20 also preferably forms a P-N junction with the drift region 14 in a portion of the substrate 12 extending between the first and second gate electrodes. A relatively highly doped emitter region 22 of first conductivity type (e.g., N+) is also provided in a portion of the substrate 12 extending adjacent the first face 12a. For example, as illustrated, the emitter region 22 may be disposed adjacent the base region 20 and between an upper surface of the first insulated gate electrode 16 and the first face 12a. The emitter region 22 also preferably forms a P-N junction with the base region 20, and this P-N junction also extends between the first and second gate electrodes. An emitter electrode 24 (e.g., metal) may be formed on an upper surface of the second gate electrode 18 and in ohmic contact with the emitter region 22 at the first face, as illustrated. The emitter electrode 24 may also be formed in ohmic contact with the base region 20 in a third dimension (not shown).

Furthermore, in the event the switching device constitutes a vertical insulated-gate bipolar transistor (IGBT), a highly doped collector region 28 (e.g., P+) is preferably provided in the substrate 12, adjacent the second face 12b. A relatively highly doped buffer layer 26 of first conductivity type (e.g., N+) is also preferably provided between the drift region 14 and the collector region 28, as illustrated. A collector electrode 30 may also be provided in ohmic contact with the collector region 28, at the second face 12b. Accordingly, forward operation of the IGBT can be achieved by biasing the collector region 28 positive relative to the emitter region 22 and by applying a sufficiently positive gate bias to the buried insulated gate electrode 16 and the second gate electrode 18. The application of a sufficiently positive gate bias causes the formation of a first inversion layer channel in a portion of the base region 20 extending adjacent the first face 12a, and a second inversion layer channel in a portion of the base region extending along an upper surface of the buried insulated gate electrode 16. These inversion layer channels electrically connect the emitter region 22 to the drift region 14 and provide a pair of low resistance paths for base drive current to enter the drift region 14 under forward biased conditions. The application of a sufficiently positive gate bias also causes the formation of an accumulation layer channel in the drift region 14 which wraps around the buried gate electrode 16. As determined by the inventor herein, this accumulation layer channel makes the current flow (and electric field lines) more uniform under the buried gate electrode 16 and improves the IGBT's forward biased safe-operating-area and forward on-state voltage drop. Alternatively, in the event the switching device constitutes a field effect transistor (e.g., MESFET, MOSFET), the emitter region may be provided as a source region and a drain region of first conductivity type may be provided in contact with the drift region. A thyristor may also be provided by making the electrical connection between the base region and emitter region a relatively high resistance electrical connection so that latch-up can be induced during forward on-state operation.

Figure 7A:
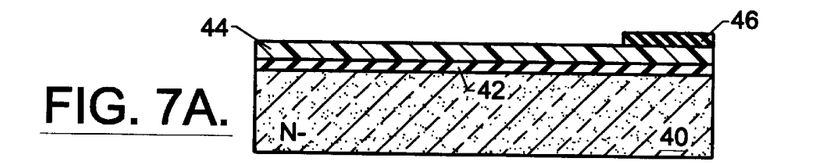
FIGS. 7A–7G are cross-sectional views of intermediate structures illustrating a method of forming a semiconductor switching device according to the first embodiment of the present invention.
Figure 7B:
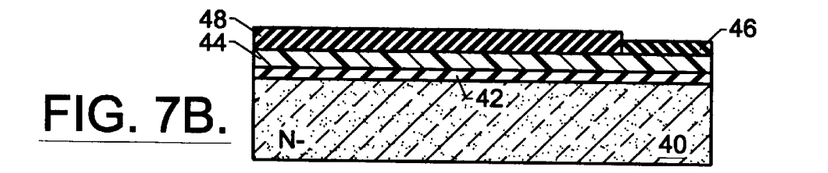

Referring now to FIGS. 7A–7G, preferred methods of forming semiconductor switching devices according to the present invention will be described. In particular, FIG. 7A illustrates the step of forming a first gate electrode insulating region 42 on a first surface of a semiconductor substrate (e.g., silicon, silicon carbide) containing a drift region 40 of first conductivity type (shown as N−) therein extending to the first surface thereof. As will be understood by those skilled in the art, the substrate may also contain a buffer region and collector region as illustrated by FIG. 6. The step of forming the first gate electrode insulating region 42 may be performed by thermally oxidizing the first surface of the drift region 40. Thereafter, a first conductive region 44 is preferably formed on the first gate electrode insulating region 42, opposite the first surface of the drift region 40. The first conductive region 44 may be formed by depositing and then doping a polycrystalline silicon layer on the first gate electrode insulating region 42. A silicon nitride layer 46 may then be deposited and patterned on the first conductive region 44, as illustrated, to expose an upper portion of the first conductive region 44. Referring now to FIG. 7B, a second gate electrode insulating region 48 is then formed in a self-aligned manner on the exposed upper portion of the first conductive region 44. In the event the first conductive region 44 comprises polycrystalline silicon, the second gate electrode insulating region 48 may be formed by thermally oxidizing the exposed upper portion of the first conductive region 44, using the patterned silicon nitride layer 46 as an oxidation mask.

Figure 7C:
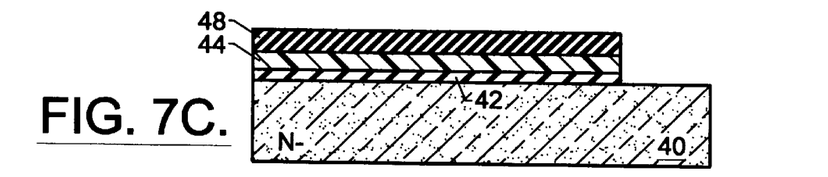

A portion of the first surface on the drift region 40 (and sidewall of the first conductive region 44) may then be exposed by selectively removing the patterned silicon nitride layer 46 and underlying portions of the first conductive region 44 and the first gate electrode insulating region 42, as illustrated by FIG. 7C. These steps may be performed by etching the patterned silicon nitride layer 46 using a hot phosphoric acid etching solution (to expose the first gate electrode insulating region 42) and then performing a dry etching step (e.g., reactive ion etching (RIE)) to remove the underlying portions of the first conductive region 44 and the first gate electrode insulating region 42. Here, according to a preferred aspect of the present invention, the second gate electrode insulating region 48 is preferably initially formed thicker than the first gate electrode insulating region 42 so that after the dry etching step, the second gate electrode insulating region 48 is thinned to a desired thickness without exposing the upper surface of the first conductive region 44.

Figure 7D:
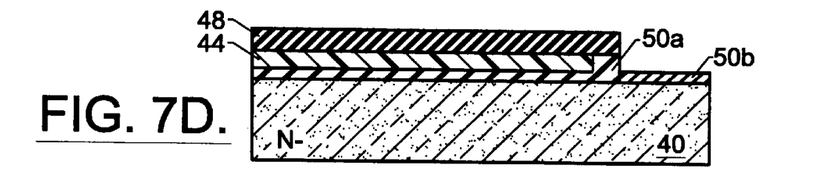
Figure 7E:
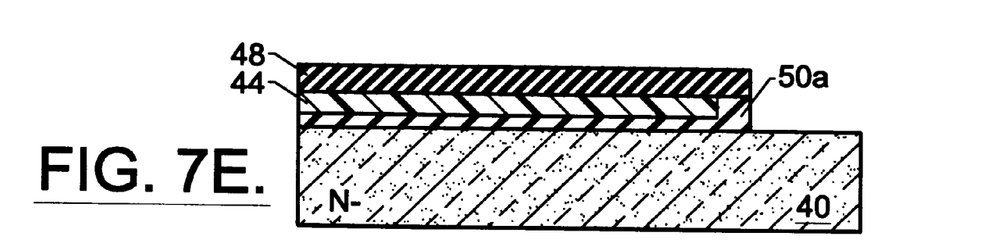

Referring now to FIG. 7D, the exposed sidewall of the first conductive region 44 and the exposed portion of the drift region 40 are then thermally oxidized. Here, because the rate at which polycrystalline silicon oxidizes is typically greater than the rate at which monocrystalline silicon oxidizes, the thickness of the thermal oxide 50a on the sidewall of the first conductive region 44 is typically greater than the thickness of the thermal oxide 50b on the exposed portion of the drift region 40. As illustrated best by FIG. 7E, a relatively short duration dry etching step may then be performed to once again expose the drift region 40. Again, the second gate electrode insulating region 48 is preferably formed to be sufficiently thick so after the short duration dry etching step, the second gate electrode insulating region 48 is thinned to a preferred final thickness without exposing the upper surface of the first conductive region 44.

Figure 7F:
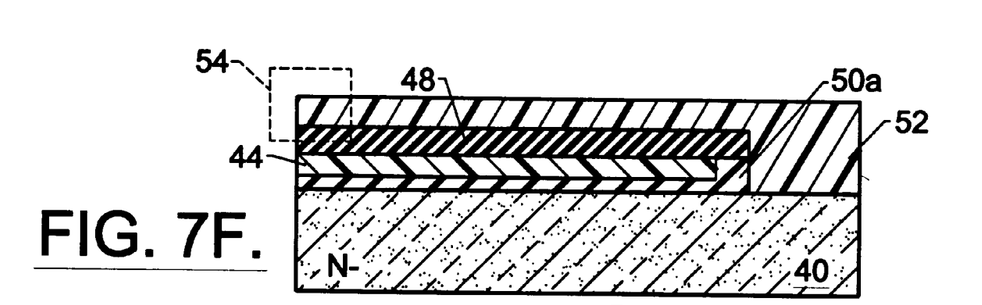

Referring now to FIG. 7F, an epitaxial lateral overgrowth (ELO) step may then be performed to form an epitaxial semiconductor region 52 (e.g., epitaxial silicon, silicon carbide) on an upper surface of the second gate electrode insulating region 48. Here, the exposed portion of the drift region 40 acts as an epitaxial "seed" to grow a high quality monocrystalline semiconductor region 52 on an upper surface of the second gate electrode insulating region 48. Because the cross-sectional illustration of FIG. 2F represents half of a typical unit cell structure, the ELO step is typically performed using two "seeds" at opposing ends of the patterned first conductive region. Thus, it can be expected that during ELO growth, a merger of adjacent epitaxial regions will occur at a position opposite a midpoint of the first conductive region 44. However, as will be understood by those skilled in the art, the merged portion 54 of the epitaxial region 52 may contain a significant amount of crystalline defects, but such defects-typically do not adversely impact the electrical characteristics of the resulting semiconductor switching device, as described more fully below.

Figure 7G:
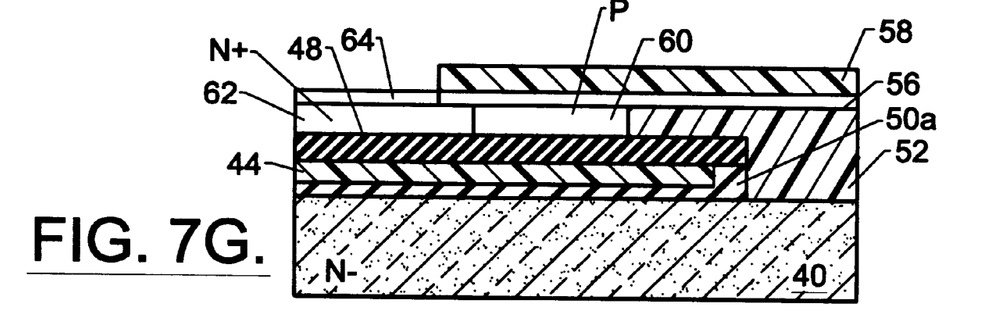

As illustrated best by FIG. 7G a standard DMOS process may then be performed to form a MOSFET in the epitaxial region 52 extending opposite the first conductive region 44. For example, another gate electrode insulating region 56 may be formed on an upper surface of the epitaxial region 52 and then a layer of polycrystalline silicon may be deposited, doped and patterned as an upper insulated gate electrode 58. In the event a MESFET is to be formed, the step of forming the additional gate electrode insulating region 56 may be omitted. The upper insulated gate electrode 58 is then used as an ion implantation mask, during the steps of implanting and driving-in boron (B) ions into the epitaxial region 52 to form a base region 60 of second conductivity type (shown as P-type) and then implanting and driving in arsenic (As) ions to form a highly doped emitter region 62 of first conductivity type. Electrical "shorts" between the emitter and base regions may also be formed at locations orthogonal to the illustrated cross-section, by patterning the arsenic implant. This allows for the use of narrow polysilicon windows without the need for critical photolithographic alignment of the emitter and polysilcon masks. A low temperature oxide layer 64 is then deposited and patterned to expose contact windows to the emitter region. A layer of metallization (not shown) is then deposited and patterned to form an emitter electrode. Steps may also be performed to electrically connect the buried insulated gate electrode to the upper gate electrode 58.

Here, the emitter region 62 is preferably formed in the merged portion 54 of the epitaxial region 52 which may contain a significant amount of crystalline defects. Yet, as will be understood by those skilled in the art, such defects typically improve (i.e., lower) the resistance characteristics of ohmic contacts formed with the emitter region 62. Thus, the fact that the ELO step may produce a merged region with a high level of defects may actually improve the electrical characteristics of devices ultimately formed therein.

Two-dimensional numerical simulations were also performed to verify the operation of an IGBT having a half unit cell construction according to the cross-sectional illustration of FIG. 6. In particular, simulations were performed on an IGBT having an N-type drift region doping concentration of $8 \times 10^{13}$ cm$^{-3}$ and an N-type buffer region doping concentration of $1 \times 10^{17}$ cm$^{-3}$. In the simulations, the half-cell width was 5 microns, the emitter region half-width was 2 microns and the half-width of the top gate electrode was 3 microns. The buried gate electrode half-width was also set at 4.5 microns so that a 0.5 micron gap was present between adjacent buried gate electrodes. The buried gate electrode was also located at a depth of between 0.2 and 0.5 microns. The top gate electrode was also biased at +15 Volts and the buried gate electrode was biased at various voltages in a range between 0 and +15 Volts. The lifetimes for holes and electrons was also set at 10 microseconds. During the simulations, it was determined that there was little difference in the on-state voltage drops for the various buried gate electrode biases when a large lifetime was selected. For an on-state current density of 100 amperes per cm$^2$, the on-state voltage drop was simulated to be 0.89 Volts for the case of a +15 Volt buried gate bias. The simulations were repeated for the case of a lifetime of 0.2 microseconds for both holes and electrons. In this case, the on-state voltage drop increased from 1.19 Volts with a +15 Volt buried gate bias, to 1.64 Volts with a 0 Volt buried gate bias. It was also determined that the application of a +15 Volt bias to the buried gate electrode improves the uniformity of the current flow underneath the buried gate electrode and that this improvement can be attributed to the extension of an accumulation layer from the base region into the drift region at an underside of the buried gate electrode. The conductivity modulation of the drift region was also determined to be better relative to a trench-type IGBT. In addition, the forward on-state voltage drop of 1.19 Volts compares favorably to 5.95 Volts for a related trench-type IGBT.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An insulated gate bipolar transistor, comprising:
   a semiconductor substrate having first and second opposing faces and a drift region of first conductivity type therein;
   a first insulated gate electrode buried in said semiconductor substrate, said first insulated gate electrode extending laterally in said semiconductor substrate in spaced relation to the first face and having an upper surface extending opposite the first face;
   a second gate electrode on the first face, extending opposite said first insulated gate electrode;
   a base region of second conductivity type in said semiconductor substrate, said base region extending between said second gate electrode and the upper surface of said first insulated gate electrode and forming a P-N junction with said drift region;
   an emitter region of first conductivity type in said semiconductor substrate, said emitter region extending between the upper surface of said first insulated gate electrode and the face and forming a P-N junction with said base region; and a first electrode electrically coupled to said emitter region.

2. The insulated gate bipolar transistor of claim 1, further comprising a collector region of second conductivity type extending adjacent the second face and a buffer region of first conductivity type extending between said drift region and said collector region and forming nonrectifying and rectifying junctions therewith, respectively.

3. The insulated gate bipolar transistor of claim 1, wherein said drift region extends between said second gate electrode and the upper surface of said first insulated gate electrode.

4. The insulated gate bipolar transistor of claim 3, wherein the P-N junction between said base region and said emitter region and the P-N junction between said base region and said drift region extend between said second gate electrode and an upper surface of said first insulated gate electrode.

5. The insulated gate bipolar transistor of claim 2, further comprising a second electrode electrically coupled to said collector region, adjacent the second face.

6. A semiconductor switching device, comprising:

a semiconductor substrate having a drift region of first conductivity type therein extending to a first face thereof;

a first insulated gate electrode buried in said semiconductor substrate, said first insulated gate electrode extending laterally in said semiconductor substrate in spaced relation to the first face and having an upper surface extending opposite the first face;

a second gate electrode on the first face, extending opposite said first insulated gate electrode;

a base region of second conductivity type in said semiconductor substrate, said base region extending between said second gate electrode and the upper surface of said first insulated gate electrode and forming a P-N junction with said drift region;

an emitter region of first conductivity type in said semiconductor substrate, said emitter region extending between the upper surface of said first insulated gate electrode and the first face and forming a P-N junction with said base region; and a first electrode electrically coupled to said emitter region.

7. The semiconductor switching device of claim 6, further comprising a collector region of second conductivity type in said semiconductor substrate and extending to a second face thereof; a buffer region of first conductivity type extending between said collector region and said drift region and having a higher first conductivity type dopant concentration therein than said drift region; and a second electrode electrically coupled to said collector region.

8. The semiconductor switching device of claim 6, wherein said drift region extends between said second gate electrode and the upper surface of said first insulated gate electrode.

9. The semiconductor switching device of claim 8, wherein the P-N junction between said base region and said emitter region and the P-N junction between said base region and said drift region extend between said second gate electrode and an upper surface of said first insulated gate electrode.

10. A field effect transistor, comprising:

a semiconductor substrate having a drift region of first conductivity type therein extending to a first face thereof;

a first insulated gate electrode buried in said semiconductor substrate, said first insulated gate electrode extending laterally in said semiconductor substrate in spaced relation to the first face and having an upper surface extending opposite the first face;

a second gate electrode on the first face, extending opposite said first insulated gate electrode;

a base region of second conductivity type in said semiconductor substrate, said base region extending between said second gate electrode and the upper surface of said first insulated gate electrode and forming a P-N junction with said drift region;

a source region of first conductivity type in said semiconductor substrate, said emitter region extending between the upper surface of said first insulated gate electrode and the first face and forming a P-N junction with said base region;

a drain region of first conductivity type electrically coupled to said drift region;

a source electrode electrically coupled to said source region; and a drain electrode electrically coupled to said drain region.

* * * * *

Dedication 5,912,497 - Bantval Jayant Baliga, Raleigh, N.C. SEMICONDUCTOR SWITCHING DEVICES HAVING BURIED GATE ELECTRODES AND METHODS OF FORMING SAME. Patent dated June 15, 1999. Dedication filed August 6, 1999, by the assignee, North Carolina State University.

Hereby dedicates to the public the entire term of said patent.
*(Official Gazette,* November 16, 1999)